United States Patent
Iwamoto et al.

(10) Patent No.: US 8,586,437 B2
(45) Date of Patent: Nov. 19, 2013

(54) SEMICONDUCTOR DEVICE AND METHOD OF MANUFACTURING THE SEMICONDUCTOR DEVICE

(75) Inventors: Toshiyuki Iwamoto, Kanagawa (JP); Gen Tsutsui, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 13/585,394

(22) Filed: Aug. 14, 2012

(65) Prior Publication Data

US 2012/0315736 A1   Dec. 13, 2012

Related U.S. Application Data

(63) Continuation of application No. 12/662,498, filed on Apr. 20, 2010, now Pat. No. 8,269,271.

(30) Foreign Application Priority Data

Apr. 23, 2009   (JP) .................................. 2009-104723

(51) Int. Cl.
    *H01L 21/8234*   (2006.01)
    *H01L 27/088*    (2006.01)

(52) U.S. Cl.
    USPC ........... 438/283; 438/157; 438/275; 257/206; 257/351

(58) Field of Classification Search
    None
    See application file for complete search history.

(56) References Cited

U.S. PATENT DOCUMENTS

| 6,911,383 | B2 | 6/2005 | Doris et al. |
| 7,060,553 | B2 | 6/2006 | Fried et al. |
| 7,129,550 | B2 | 10/2006 | Fujiwara et al. |

(Continued)

FOREIGN PATENT DOCUMENTS

| JP | H 11-340464 (A) | 12/1999 |
| JP | 2000-150879 (A) | 5/2000 |

(Continued)

OTHER PUBLICATIONS

M. Guillorn, et al. "FinFET Performance Advantage at 22nm: An AC Perspective", 2008 Symposium on VLSI Technology Digest of Technical Papers, pp. 12-13(2008).

(Continued)

*Primary Examiner* — Zandra Smith
*Assistant Examiner* — Pamela E Perkins
(74) *Attorney, Agent, or Firm* — McGinn IP Law Group, PLLC

(57) ABSTRACT

A method of manufacturing a semiconductor device includes forming a first region including a FinFET (Fin Field Effect Transistor), forming a second region including a PlanarFET (Planar Field Effect Transistor), forming first extension regions in the plurality of fins in the first region, forming second extension regions in the second region using the second gate electrode as a mask, forming first side walls and second side walls on side surfaces of the first gate electrode and on side surfaces of the second gate electrode, respectively, and forming a source and a drain of the FinFET in the first region using the first gate electrode and first side walls as masks and forming a source and a drain of the PlanarFET in the second region by an ion implantation method using the second gate electrode and second side walls as masks, at the same time.

15 Claims, 18 Drawing Sheets

(56) References Cited

U.S. PATENT DOCUMENTS

| | | |
|---|---|---|
| 7,163,851 B2 | 1/2007 | Abadeer et al. |
| 7,180,134 B2 | 2/2007 | Yang et al. |
| 7,250,658 B2 | 7/2007 | Doris et al. |
| 7,256,464 B2 | 8/2007 | Liao et al. |
| 7,259,420 B2 | 8/2007 | Anderson et al. |
| 7,425,740 B2 | 9/2008 | Liu et al. |
| 7,473,946 B2 | 1/2009 | Anderson et al. |
| 7,547,947 B2 | 6/2009 | Anderson et al. |
| 7,566,619 B2 | 7/2009 | Ahn et al. |
| 7,569,897 B2 | 8/2009 | Anderson et al. |
| 7,687,859 B2 | 3/2010 | Russ et al. |
| 7,692,250 B2 | 4/2010 | Booth et al. |
| 7,737,532 B2 | 6/2010 | Ke et al. |
| 7,785,955 B2 | 8/2010 | Anderson et al. |
| 7,872,310 B2 | 1/2011 | Abadeer et al. |
| 7,915,691 B2 | 3/2011 | Wong et al. |
| 7,915,713 B2 | 3/2011 | Faul et al. |
| 7,923,337 B2 | 4/2011 | Chang et al. |
| 7,932,564 B2* | 4/2011 | Goto et al. ............ 257/368 |
| 2004/0092062 A1* | 5/2004 | Ahmed et al. ............ 438/197 |
| 2006/0263948 A1 | 11/2006 | Maekawa |
| 2007/0108528 A1 | 5/2007 | Anderson et al. |
| 2007/0184602 A1 | 8/2007 | Anderson et al. |
| 2007/0210355 A1 | 9/2007 | Izumida |
| 2008/0093676 A1 | 4/2008 | Shingu et al. |
| 2008/0299711 A1 | 12/2008 | Anderson et al. |
| 2009/0170339 A1* | 7/2009 | Trentzsch et al. ............ 438/765 |
| 2010/0062575 A1* | 3/2010 | Kinoshita et al. ............ 438/199 |

FOREIGN PATENT DOCUMENTS

| | | |
|---|---|---|
| JP | 2004-88101 | 3/2004 |
| JP | 2005-19996 A | 1/2005 |
| JP | 2005-86024 A | 3/2005 |
| JP | 2006-253198 (A) | 9/2006 |
| JP | 2008-242737 (A) | 9/2007 |
| JP | 2008-060101 (A) | 3/2008 |
| JP | 2009-016423 (A) | 1/2009 |
| WO | 2005/020325 A1 | 3/2005 |

OTHER PUBLICATIONS

Japanese Decision of Refusal dated Aug. 14, 2013, with partial English-language translation.

Japanese Notification of Reasons for Refusal dated May 17, 2013, with partial English-language translation.

* cited by examiner

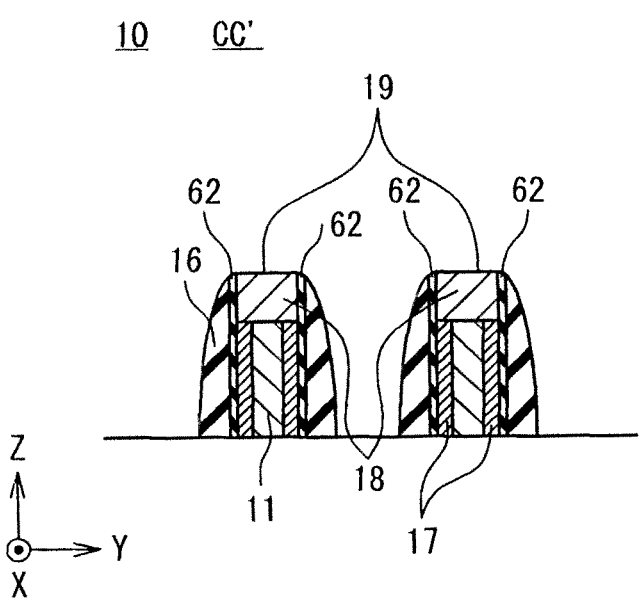

SEMICONDUCTOR DEVICE AND METHOD OF MANUFACTURING THE SEMICONDUCTOR DEVICE

CROSS-REFERENCE TO RELATED APPLICATIONS

The present application is a Continuation application of U.S. patent application Ser. No. 12/662,498, filed Apr. 20, 2010 now U.S. Pat. No. 8,269,271, the entire contents of which is incorporated herein by reference, and claims priority from Japanese Patent Application No. 2009-104723, filed Apr. 23, 2009, the entire contents of which is incorporated herein by reference.

BACKGROUND OF THE INVENTION

1. Field of the Invention

The present invention relates to a semiconductor device and a method of manufacturing the semiconductor device and, in particular, to a semiconductor device including a field effect transistor and a method of manufacturing the semiconductor device.

2. Description of Related Art

A FinFET (Fin Field Effect Transistor) has been known as one of field effect transistors. The FinFET has a device structure considered to be promising in a device using the technology of the 22 nm-node and thereafter. The FinFET has the following merits that the FinFET has higher resistance to short channel effect and can reduce random variations in impurities as compared with a Planar FET (Planar Field Effect Transistor). In this manner, the FinFET has an advantage in constructing a transistor having a very small gate length and hence has been developed with the progress of fine miniaturization of LSI (Large Scale Integration) circuit.

As one example of the Fin FET, a semiconductor device and a method of manufacturing the same are disclosed in Japanese Patent Publication No. JP2005-86024A (patent literature 1 corresponding to U.S. Pat. No. 7,129,550(B2)). This semiconductor device includes: a semiconductor substrate; a semiconductor layer formed on the semiconductor substrate and shaped like a fin that is long in a first direction and that is short in a second direction intersecting the first direction; a gate insulating layer formed on a side surface of the second direction of the semiconductor layer; a gate electrode arranged next to the gate insulating layer; a channel region formed at a position adjacent to the gate insulating layer in the semiconductor layer; source/drain extension regions formed at positions adjacent in the first direction to the channel region in the semiconductor layer; and source/drain regions formed at positions adjacent in the first direction to the source/drain extension regions in the semiconductor layer. The semiconductor device is characterized in that the width in the second direction of the semiconductor layer in the channel region is narrower than the width in the second direction of the semiconductor layer in the source/drain regions.

Further, as a relating technology, a technology of a FinFET is disclosed in "FinFET Performance Advantage at 22 nm: An AC perspective" by M. Guillorn, et al., 2008 Symposium on VLSI Technology Digest of Technical Papers, pp. 12-13 (2008) (non-patent literature 1). This literature discloses a fact that one disadvantage of the FinFET is large parasitic resistance. The literature also discloses a technology for epitaxially growing silicon in the source/drain regions (SD regions) to reduce the parasitic resistance as a method of solving the disadvantage.

Still further, as another relating technology, a hybrid planar and FinFETCMOS device is disclosed in Japanese Patent Publication JP2005-19996A (patent literature 2 corresponding to U.S. Pat. No. 6,911,383 (B2)). A method for forming this integrated semiconductor circuit includes: a step of providing a silicon-on-insulator structure including at least one top semiconductor layer arranged on an embedded insulating layer, the top semiconductor layer including at least one patterned hard mask arranged in a FinFET region of the structure and at least one patterned hard mask arranged in a FET region of the structure; a step of protecting the FET region and trimming the at least one patterned hard mask in the FinFET region; a step of etching such an exposed portion of the top semiconductor layer that is not protected by the hard mask stopping over the embedded insulating layer to thereby form a FinFET activating device region and a FET activating device region, the FinFET activating device region being vertical to the FET activating device region; a step of protecting the FinFET activating device region and of thinning the FET activating device region to thereby make the FET activating device region smaller in height than the FinFET activating device region; a step of forming a gate dielectric on respective exposed vertical surfaces of the FinFET activating device region and of forming a gate dielectric on an exposed horizontal surface of the FET activating device region; and a step of forming a patterned gate electrode on the respective exposed surfaces of the gate dielectric body.

Still further, an integrated circuit chip and a method for manufacturing the same are disclosed in Japanese Patent Publication No. JP2004-88101A (patent literature 3 corresponding to U.S. Pat. No. 7,163,851(B2)). This integrated circuit chip includes at least one fin-type field effect transistor and at least one thick body device. In this integrated circuit chip, the at least one fin-type field effect transistor and the at least one thick body device are formed at the same time.

Still further, a semiconductor device and a method of manufacturing the same are disclosed in International Publication No. WO2005/020325 (patent literature 4). This semiconductor device has a MIS-type field effect transistor including: a semiconductor projecting portion projecting from a plane of a substrate; a gate electrode extending on both opposite side surfaces from a top surface of the semiconductor projecting portion so as to straddle the semiconductor projecting portion; an insulating film formed between the gate electrode and the semiconductor projecting portion; and source/drain regions. This semiconductor device has a plurality of kinds of transistors formed as MIS-type field effect transistors in one chip, the transistors being different from each other in width W in a direction that is parallel to the plane of the substrate in the semiconductor projecting portion below the gate electrode and that is vertical to a channel longitudinal direction.

We have now discovered the following facts.

A semiconductor device is composed of a core transistor that primarily performs a logical operation and a high withstand voltage I/O transistor that performs data input from and data output to the outside. A case where these transistors are manufactured by using a FinFET will be studied.

In a process of forming an impurity layer, extension implant and halo implant need to be performed not only to the top portion of a fin but also to the side plane thereof so as to make a channel plane. However, in the case where a plurality of fins are formed, the spacing between the fins is narrow and hence when a typical ion implantation apparatus is used, a shadowing effect is caused to thereby make it difficult to implant ions. Thus, it has been studied that plasma doping is used for forming the FinFET in place of ion implantation.

When the plasma doping is used for a process of forming the impurity layer of the FinFET, even if the spacing between the fins is narrow, impurities can be implanted into the channel plane by dispersion and diffusion of the impurities. However, in the case where the plasma doping is used, since the plasma doping is based on the principle of dispersion and diffusion of the impurities, the impurities cannot be deeply implanted as compared with the case where ion implantation is used. Thus, a mask oxide film used for the plasma doping needs to be made as thin as possible.

Here, the high withstand voltage I/O transistor needs to have a gate insulating film made thicker than the core transistor. In this case, there is brought about the following state: after a fin gate is formed, the core transistor has an oxide film having a thickness of, for example, 2 nm or less formed in the source/drain regions (SD regions) thereof but the high withstand voltage I/O transistor has an oxide film, which is thicker than that of core transistor, formed in the SD regions thereof. In this state, the implanting of impurities into the extension regions by the plasma doping is thought to be difficult. Therefore, in the FinFET, it is difficult to increase the thickness of the gate insulating film to increase the withstand voltage.

In this manner, in a semiconductor device using the technology of the 22 nm-node and thereafter, the manufacturing of the core transistor and the I/O transistor by using the FinFETs is thought to be extremely difficult.

SUMMARY

The present invention seeks to solve one or more of the above problems, or to improve upon those problems at least in part.

In one embodiment, a semiconductor device includes: a FinFET (Fin Field Effect Transistor) configured to be provided on a chip; and a PlanarFET (Planar Field Effect Transistor) configured to be provided on the chip; wherein a second gate insulating layer of the PlanarFET is thicker than a first gate insulating layer of the FinFET.

In another embodiment, a method of manufacturing a semiconductor device, includes: providing a semiconductor substrate, the semiconductor substrate including: a first region where a FinFET (Fin Field Effect Transistor) is to be formed, and a second region where a PlanarFET (Planar Field Effect Transistor) is to be formed, wherein the first region includes: a plurality of fins formed on a substrate and parallel to each other, a first insulating film formed on the plurality of fins, a second insulating film formed on the first insulating film, and a first conducting film formed on the second insulating film, wherein the first insulating film, the second insulating film, and the first conducting film have a pattern of a first gate electrode of the FinFET, wherein the second region includes: the first insulating film formed on the substrate, the second insulating film formed on the first insulating film, and the first conducting film formed on the second insulating film, wherein the first insulating film, the second insulating film, and the first conducting film have a pattern of a second gate electrode of the PlanarFET wherein a thickness of the first insulating film in the second region is larger than a thickness thereof in the first region; forming first extension regions in the plurality of fins in the first region by a plasma doping method using the first gate electrode as a mask; forming second extension regions in the second region by one of an ion implantation method and a plasma doping method using the second gate electrode as a mask; forming first side walls and second side walls on side surfaces of the first gate electrode and on side surfaces of the second gate electrode, respectively; and forming a source and a drain of the FinFET in the first region by an ion implantation method using the first gate electrode and first side walls as masks and forming a source and a drain of the PlanarFET in the second region by anion implantation method using the second gate electrode and second side walls as masks, at the same time.

The semiconductor device according to the present invention can reduce a chip area by fine miniaturization using FinFETs, while keeping and improving characteristics required for each element.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 2C is a section view along the line CC' in FIG. 1 showing the structure of the semiconductor device according to the embodiment of the present invention;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, a semiconductor device according to an embodiment of the present invention and a method of manufacturing the semiconductor device will be described.

The semiconductor device of the present invention includes FinFETs and PlanarFETs formed together on a same chip. In other words, on the same chip, a transistor that needs to be operated at a high operation speed and to be finely miniaturized (exemplified by a primitive transistor for a logical device and a cell transistor for an SRAM) is configured using a FinFET, and a transistor that needs to have a gate insulating film with high withstand voltage (exemplified by a transistor for an analog system or an I/O system) is configured using a PlanarFET. Herein, a FET is exemplified by a MOS (Metal Oxide Semiconductor) FET. The employment of this configuration can realize the FinFET, which is operated at a high operation speed and is finely miniaturized, and the PlanarFET for I/O system, which has a gate insulating film with high withstand voltage, on one chip. In this case, it is preferable that the FinFET has a relatively short gate length. This is because the relatively short gate length is easy to fulfill the abovementioned characteristics of the FinFET. On the other hand, even if the PlanarFET has a relatively long gate length, the PlanarFET presents no problem. This is because the PlanarFET is operated at a relatively slow operation speed. Hereinafter, the FinFET and the PlanarFET will be described in detail.

Figure 1:
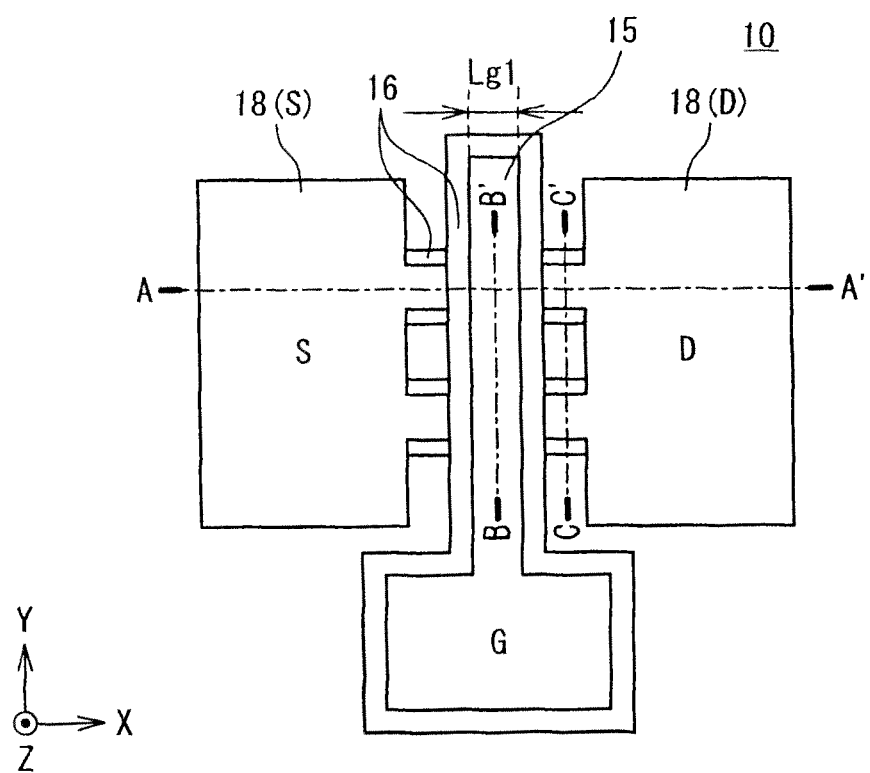
FIG. 1 is a plan view showing a structure of a semiconductor device according to an embodiment of the present invention.
Figure 2A:
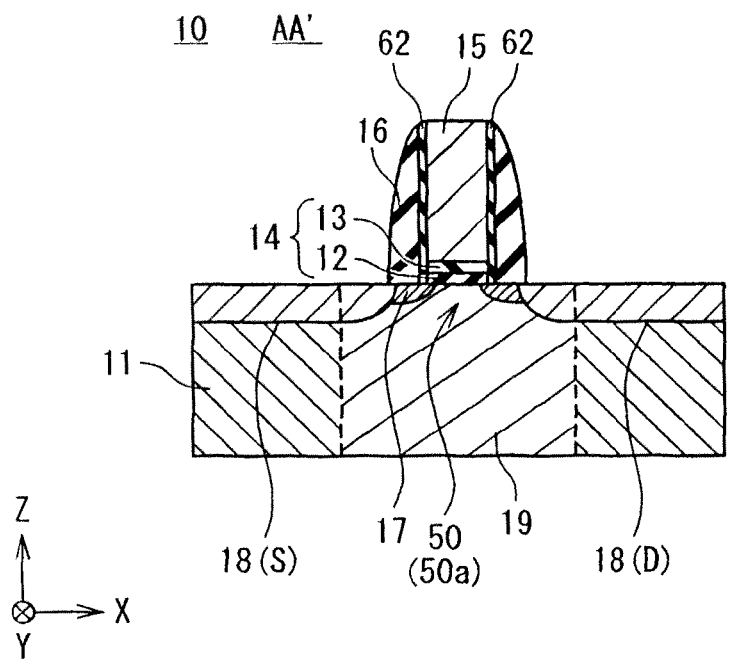
FIG. 2A is a section view along the line AA' in FIG. 1 showing the structure of the semiconductor device according to the embodiment of the present invention.
Figure 2B:
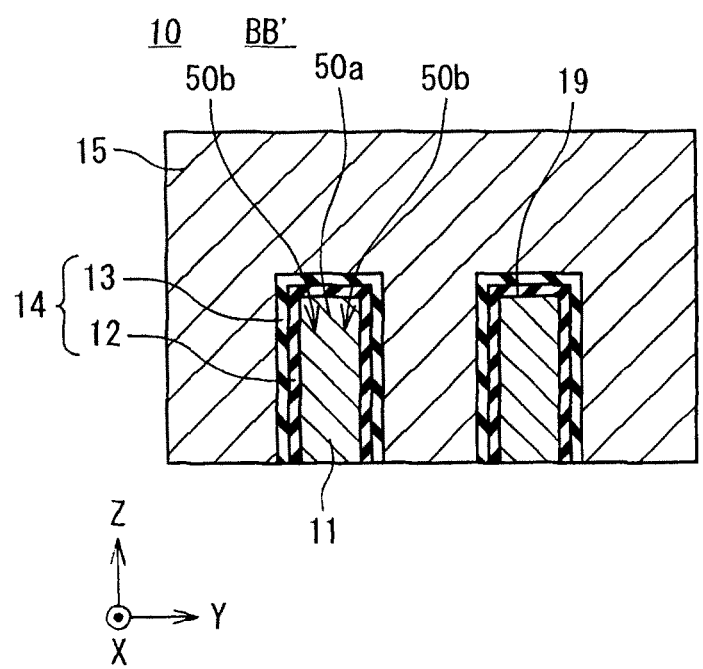
FIG. 2B is a section view along the line BB' in FIG. 1 showing the structure of the semiconductor device according to the embodiment of the present invention.

First, the FinFET will be described. FIG. 1 is a plan view showing a structure of the semiconductor device according to an embodiment of the present invention. FIGS. 2A to 2C are section views along the lines AA', BB' and CC' in FIG. 1, respectively. A FinFET 10 includes a semiconductor substrate 11, a source 18(S), a drain 18(D) a gate electrode 15, extension regions 17, a gate insulating layer 14, side walls 16, and offset spacers 62.

The semiconductor substrate 11 is a semiconductor layer of a first conduction type (e.g., p type). The semiconductor substrate 11 is exemplified by silicon. The semiconductor substrate 11 includes regions formed for a source (S) and a drain (D) and a plurality of fins 19 formed for a channel region. The regions formed for the source and the drain are formed in the shape of a plate of rectangular solid and are arranged side by side in X direction. Each of the plurality of fins 19 is formed in the shape of a fin of rectangular solid and is extended in X direction. The plurality of fins 19 is arranged side by side in parallel to each other in Y direction. Each of the plurality of fins 19 is connected to the region formed for the source at one end and is connected to the region formed for the drain at the other end.

The source 18(S) and the drain 18(D) are the semiconductor layers of a second conduction type (e.g., n type). They are formed in surface regions formed for the source and the drain in the semiconductor substrate 11, respectively. The source 18(S) is further extended to the bottom of the side wall 16 on the source 18(S) side of the surface regions of the plurality of fins 19. The drain 18(D) is further extended to the bottom of the side wall 16 on the drain 18(D) side of the surface regions of the plurality of fins 19.

The extension region 17 is a semiconductor layer of the second conduction type (e.g., n type) having a lower concentration than the concentrations of the source 18(S) and the drain 18(D). The extension region 17 is formed on the surface region of each of the plurality of fins 19, is extended from the tip of the source 18(S) or the drain 18(D) to the bottoms of the side wall 16 and the offset spacer 62, and is slightly overlaid on a channel region. A region, which is the surface region of each of the plurality of fins 19 and is arranged between the extension region 17 on the source (S) side and the extension region 17 on the drain (D) side, becomes a channel region 50 (50a, 50b).

The gate insulating layer 14 is formed so as to cover the channel region 50 and includes a first insulating layer 12 and a second insulating layer 13. The first insulating layer 12 is formed on the channel region 50. The second insulating layer 13 is formed on the first insulating layer 12. The first insulating layer 12 is exemplified by silicon oxide (SiOx) and is formed in a film thickness of, for example, 0.5 nm. The second insulating layer 13 is formed of a high dielectric constant material (High-k), is exemplified by hafnium nitride silicate (HfSiOxNy) or hafnium oxide (HfOz), and is formed in a film thickness of, for example, 2 nm.

The gate electrode 15 is formed on the gate insulating layer 14. The gate layer 15 is extended in Y direction and is formed so as to cover the plurality of fins 19. In other words, the gate electrode 15 is connected to the plurality of fins 19 via the gate insulating layer 14. The surface region of the fin 19 connected to the gate electrode 15 via the gate insulating layer 14 becomes the channel region 50 (50a, 50b). The gate electrode 15 is exemplified by a metal, titan nitride (TiN)/amorphous silicon layer or the like. A gate length Lg1 is a length of the channel region 50 in the fin 19 in the X direction (substantially, the width of the gate electrode 15).

The side wall 16 is formed so as to cover the extension region 17 and the side wall of the gate electrode 15 and so as to cover the side wall of the fin 19. The side wall 16 is exemplified by silicon nitride (SiNy) or a laminated film of silicon nitride and silicon oxide (SiNy/SiOx). Moreover, the offset spacer 62 is formed between the side wall 16 and the gate electrode 15. The offset spacer 62 is exemplified by a silicon nitride (SiNy) film having a thickness of 3 to 5 nm.

Figure 3:
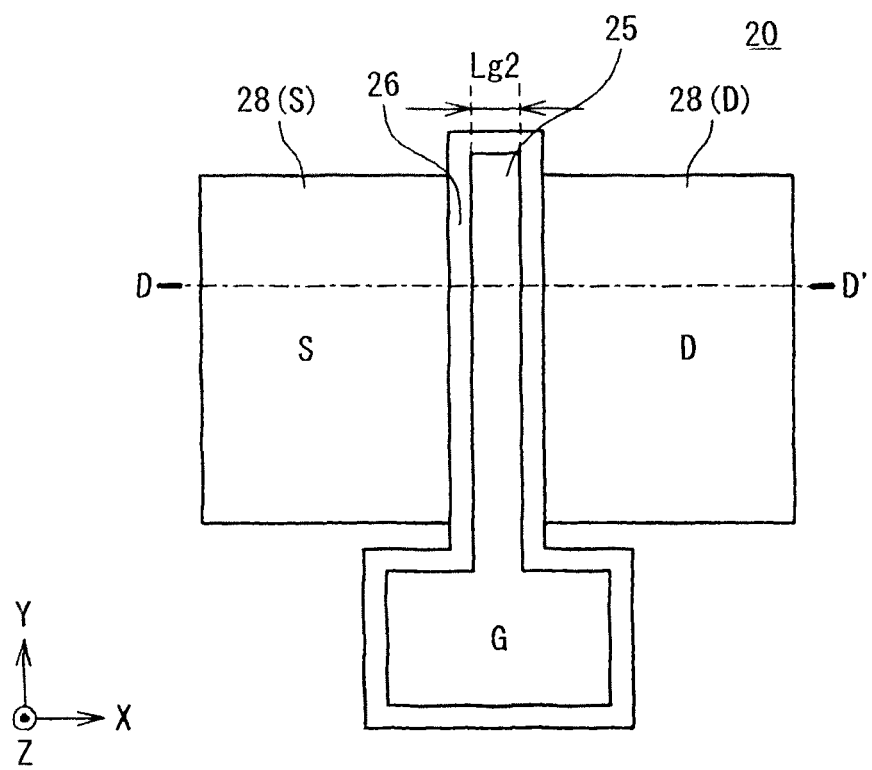
FIG. 3 is a plan view showing a structure of the semiconductor device according to the embodiment of the present invention.
Figure 4:
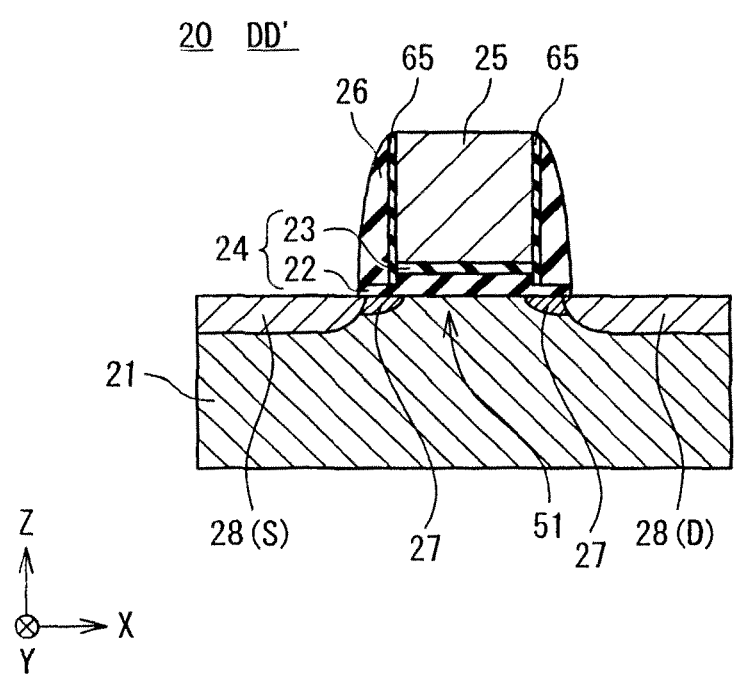
FIG. 4 is a section view along the line DD' in FIG. 3 showing the structure of the semiconductor device according to the embodiment of the present invention.

Next, the PlanarFET 20 will be described. FIG. 3 is a plan view showing a structure of the semiconductor device according to the embodiment of the present invention. FIG. 4 is a section view along the line DD' in FIG. 3, a MOS transistor exemplifies The PlanarFET 20. The PlanarFET 20 includes a semiconductor substrate 21, a source 28(S), a drain 28(D), a gate electrode 25, extension regions 27, a gate insulating layer 24, side walls 26, and offset spacers 65.

The semiconductor substrate 21 is a semiconductor layer of the first conduction type (e.g., p type). The semiconductor substrate 21 is exemplified by silicon.

The source 28(S) and the drain 28(D) are the semiconductor layers of the second conduction type (e.g., n type) and are formed on the surface region of the semiconductor substrate 21. The source 28(S) is extended to the bottom of the side wall 26 on the source 28(S) side in the surface region. The drain 28(D) is extended to the bottom of the side wall 26 on the drain 28(D) side in the surface region.

The extension region 27 is a semiconductor layer of the second conduction type (e.g., n type) having a lower concentration than the concentrations of the source 28(S) and the drain 28(D). The extension region 27 is formed on the surface region of the semiconductor substrate 21, is extended from the tip of the source 28(S) or the drain 28(D) to the bottoms of the side wall 26 and the offset spacer 65, and is slightly overlaid on a channel region. A region, which is the surface region of the semiconductor substrate 21 and is arranged between the extension region 27 on the source (S) side and the extension region 27 on the drain (D) side, becomes a channel region 51.

The gate insulating layer 24 is formed so as to cover the channel region 51 and the extension regions 27 and includes a first insulating layer 22 and a second insulating layer 23. The first insulating layer 22 is formed on the channel region 51 and the extension regions 27. The second insulating layer 23 is formed on the first insulating layer 22 above the channel region 51 and on the first insulating layer 22 above the end portions of the extension regions 27. The first insulating layer 22 is exemplified by oxide silicon (SiOx) and is formed in a film thickness of, for example, 7 nm. The second insulating layer 23 is formed of a high dielectric constant material (High-k), is exemplified by hafnium nitride silicate (HfSiOxNy) or hafnium oxide (HfOz), and is formed in a film thickness of, for example, 2 nm.

The gate electrode 25 is formed on the gate insulating layer 24 (on the second insulating layer 23 above the channel region 51). The gate electrode 25 is formed so as to extend in Y direction. The surface region of the semiconductor substrate 21 connected to the gate electrode 25 via the gate insulating layer 24 becomes the channel region 51. The gate electrode 25 is exemplified by a metal, titan nitride (TiN)/amorphous silicon layer or the like. A gate length Lg2 is a length of the channel region 51 in the semiconductor substrate 21 in the X direction (substantially, the width of the gate electrode 25).

The side wall 26 is formed so as to cover the side wall of the gate electrode 25 and the first insulating layer 22 (on the extension region 27). The side wall 26 is exemplified by silicon nitride (SiNy) or a laminated film of silicon nitride and silicon oxide (SiNy/SiOx). The offset spacer 65 is formed between the side wall 26 and the gate electrode 25. The offset spacer 65 is exemplified by a silicon nitride (SiNy) film having a thickness of 3 to 5 nm.

The FinFET 10 has the following merit: when the FinFET 10 is compared with the PlanarFET 20, the FinFET 10 can have higher resistance to short channel effect and can further reduce random variations. Thus, in this embodiment, it is preferable that a transistor (for example, a primitive transistor for a logical device and a cell transistor of an SRAM), which is short in the gate length and is small in the film thickness of the gate insulating layer, is configured using the FinFET. This configuration can promote the fine miniaturization of the transistor with high performance.

On the other hand, the PlanarFET 20 has the following merit: when the PlanarFET 20 is compared with the FinFET 10 that has a three-dimensional device structure and that hence is hard to be manufactured, the PlanarFET 20 is easily manufactured and is excellent particularly in the quality of the gate insulating layer. For example, the PlanarFET 20 has a uniform gate insulating layer and does not cause such an electric field concentration at the corner of the channel region that appears in the FinFET 10. Thus, in this embodiment, it is preferable that a transistor (for example, a transistor for an analog or I/O system), which is long in the gate length and is large in the film thickness of the gate insulating layer, is configured using the PlanarFET. This configuration can produce the high resistance (reliability) of the gate insulating film of the transistor.

The employment of this configuration can realize the fine miniaturized FinFET having high performance and the PlanarFET for I/O system having a gate insulating film with high withstand voltage on one chip.

Next, the method of manufacturing the semiconductor device according to the present invention will be described. FIGS. 5A-5D to 9A-9D are section views showing the method of manufacturing the semiconductor device according to the embodiment of the present invention. Here, FIGS. 5A, 6A, 7A, 8A, and 9A are section views along the line AA' in FIG. 1. FIGS. 5B, 6B, 7B, 8B, and 9B are section views along the line BB' in FIG. 1. FIGS. 5C, 6C, 7C, 8C, and 9C are section views along the line CC' in FIG. 1. These views show the process of forming the FinFET 10. FIGS. 5D, 6D, 7D, 8D, and 9D are section views along the line D-D' in FIG. 3. These views show the process of forming the PlanarFET 20. The FinFET 10 and PlanarFET 20 are formed on a same chip. FIGS. 5A, 5B, 5C, and 5D show the states of the respective portions at the same timing in the method of manufacturing the semiconductor device. FIGS. 6A, 6B, 6C, and 6D show the states of the respective portions at the same timing in the method of manufacturing the semiconductor device. FIGS. 7A, 7B, 7C, and 7D show the states of the respective portions at the same timing in the method of manufacturing the semiconductor device. FIGS. 8A, 8B, 8C, and 8D show the states of the respective portions at the same timing in the method of manufacturing the semiconductor device. FIGS. 9A, 9B, 9C, and 9D show the states of the respective portions at the same timing in the method of manufacturing the semiconductor device.

Figure 5A:
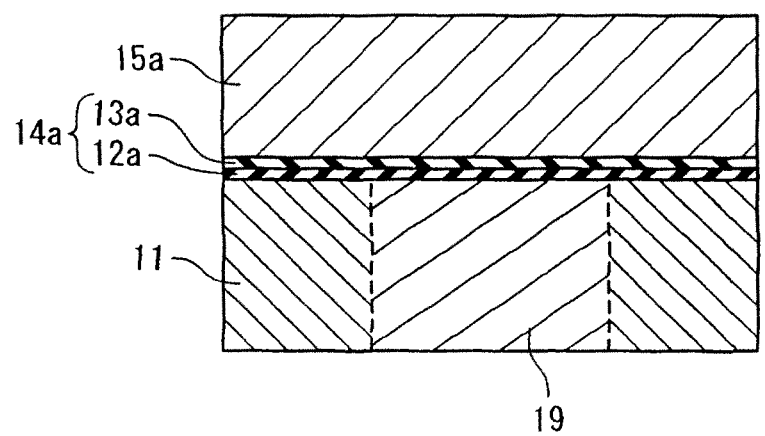
FIG. 5A is a section view showing a method of manufacturing the semiconductor device according to the embodiment of the present invention.
Figure 5B:
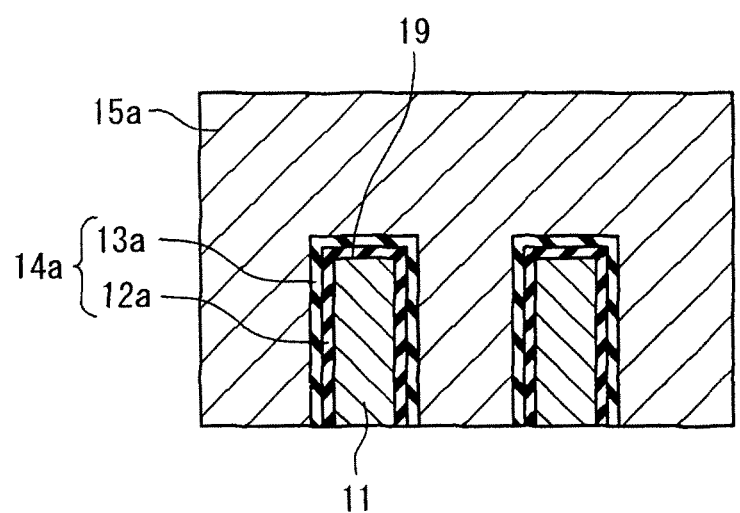
FIG. 5B is a section view showing the method of manufacturing the semiconductor device according to the embodiment of the present invention.
Figure 5C:
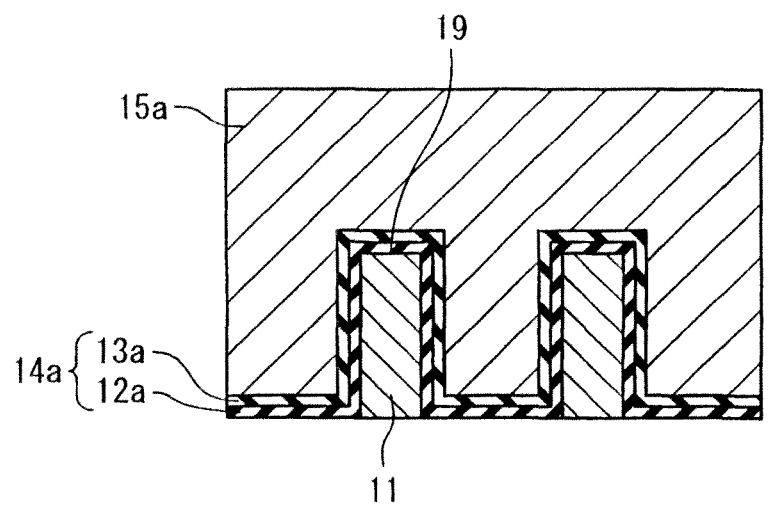
FIG. 5C is a section view showing the method of manufacturing the semiconductor device according to the embodiment of the present invention.

As shown in FIGS. 5A to 5C, firstly, in the semiconductor substrate 11 (e.g., p type silicon), regions for a source (S) and a drain (D) and a plurality of fins 19 for a channel are formed in a region (first region) where the FinFET 10 is formed. Here, the regions for the source (S) and the drain (D) are formed nearly in the shape of a plate of rectangular solid, respectively, and are arranged side by side in X direction. Each of the plurality of fins 19 is formed in the shape of a fin of rectangular solid and is extended in X direction. The plurality of fins 19 are arranged side by side in parallel with each other in Y direction. Each of the plurality of fins 19 is connected to the region for the source (S) at one end and is connected to the region of drain (D) at the other end. Next, a first insulating film 12a (e.g., silicon oxide) is formed, for example, in a thickness of about 0.5 nm by an ISSG (In-Situ Steam Generation) oxidation method so as to cover the semiconductor substrate 11. Subsequently, a second insulating film 13a (e.g., hafnium nitride silicate) is formed, for example, in a thickness of about 2 nm by a CVD method so as to cover the first insulating film 12a. Next, a gate electrode film 15a is formed, for example, in a thickness of about 40 to 45 nm by a sputtering method. As for the gate electrode film, for example, a laminated film is used which includes a TiN layer having a thickness of 5 nm and an amorphous silicon layer having a thickness of 40 nm formed on the TiN layer. The reason why the structure that the amorphous silicon layer is laminated on the TiN layer is employed is to prevent the TiN layer from being etched by a SPM (Sulfuric acid Hydrogen Peroxide) solution of a solution to remove resist used for forming the extension region, which will be described later. As for another gate electrode film, for example, a single layer formed of W, TaSi, or TaSiN can be used. These metals do not present the problem that they are etched by the solution to remove the resist and hence the surface of the gate electrode film formed of these metals does not need to be covered with the amorphous silicon film.

Figure 5D:
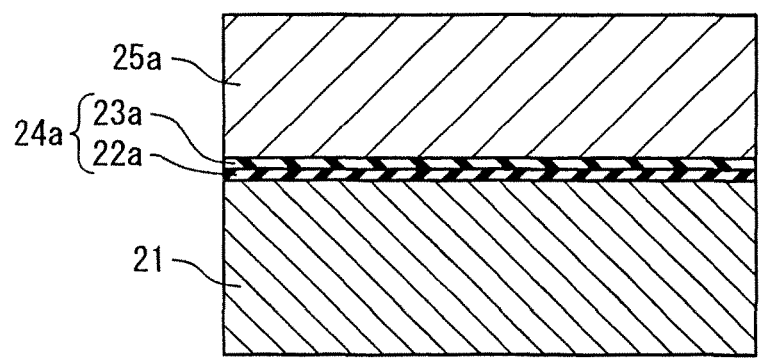
FIG. 5D is a section view showing the method of manufacturing the semiconductor device according to the embodiment of the present invention.

On the other hand, as shown in FIG. 5D, in the semiconductor substrate 21 (e.g., p type silicon), a first insulating film 22a (e.g., silicon oxide) is formed, for example, in a thickness of about 7 nm by the ISSG oxidation method in a region (second region) where the PlanarFET 20 is formed so as to cover the semiconductor substrate 21. Subsequently, a second insulating film 23a (e.g., hafnium nitride silicate) is formed, for example, in a thickness of about 2 nm by the CVD method so as to cover the first insulating film 22a. Next, a gate electrode film 25a (e.g., titanium nitride) is formed, for example, in a thickness of about 40 to 45 nm by the sputtering method. As for the gate electrode film, for example, a laminated film is used which includes a TiN layer having a thickness of 5 nm and an amorphous silicon layer having a thickness of 40 nm formed on the TiN layer. The reason why the structure that the amorphous silicon layer is laminated on the TiN layer is employed is to prevent the TiN layer from being etched by the SPM (Sulfuric acid Hydrogen Peroxide) solution of the solution to remove the resist used for forming the extension region, which will be described later. As for the other gate electrode film, for example, a single layer formed of W, TaSi, or TaSiN can be used. These metals do not present the problem that they are etched by the solution to remove the resist and hence the surface of the gate electrode film formed of these metals does not need to be covered with the amorphous silicon film.

Here, the semiconductor substrate 11 and the semiconductor substrate 21 are the same substrate. First, the first insulating film 22a is formed, and then the first insulating film 22a in the second region is covered with the resist or the like, and then only the first insulating film 22a in the first region is removed by wet etching. Subsequently, the first insulating film 12a of a thin film is formed, and then the second insulating film 13a and the second insulating film 23a are formed. In this case, the second insulating film 13a and the second insulating film 23a are the same film. In other words, the laminated film formed of the first insulating film 12a and the second insulating film 13a in the first region is relatively thin as a whole, while the laminated film formed of the first insulating film 22a and the second insulating film 23a in the second region is relatively thick as a whole. As a result, the gate insulating film 14a for the FinFET becomes thin (for example, about 2.5 nm) as a whole, whereas the gate insulating film 24a for the PlanarFET becomes thick (for example, about 9 nm) as a whole. In the case where the gate electrode film 15a is the same as the gate electrode film 25a, these gate electrode films 15a, 25a are formed of the same film by the same process. In the second region, an oxidation atmosphere forming the second insulating film is additionally applied to the first insulating film 22a, but because the first insulating film 22a is relatively thicker than the first insulating film 12a and the growth of the first insulating film 22a is saturated, the gate oxide film 24a can be regarded as a laminated layer formed substantially of the first insulating film 22a and the second insulating film 23a as shown in the drawing.

Figure 6A:
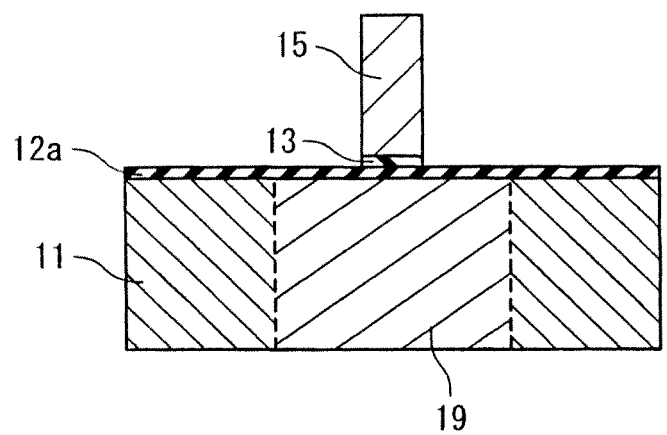
FIG. 6A is a section view showing the method of manufacturing the semiconductor device according to the embodiment of the present invention.
Figure 6B:
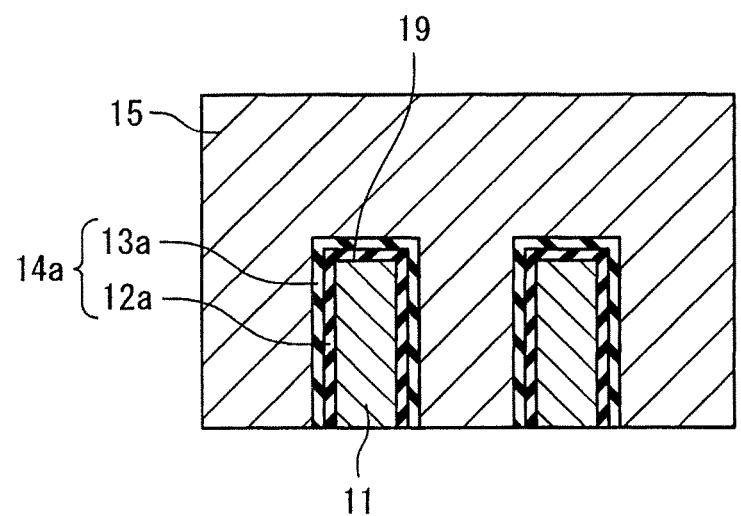
FIG. 6B is a section view showing the method of manufacturing the semiconductor device according to the embodiment of the present invention.
Figure 6C:
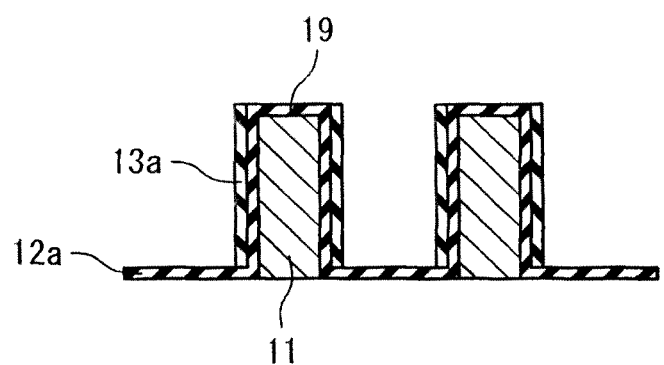
FIG. 6C is a section view showing the method of manufacturing the semiconductor device according to the embodiment of the present invention.

Next, as shown in FIGS. 6A to 6C, the gate electrode film 15a is etched in a specified gate pattern by photolithography and RIE (Reactive Ion Etching). With this etching, the gate electrode 15 is formed so as to extend in Y direction and to cover the plurality of fins 19. With this etching, the second insulating film 13a not covered with the gate electrode 15 on the top surface (including the top surfaces of the fins 19) of the semiconductor substrate 11 is also etched, whereby the second insulating layer 13 is formed directly below the gate electrode 15. Here, the second insulating film 13a on the side of the fin 19 is left.

Figure 6D:
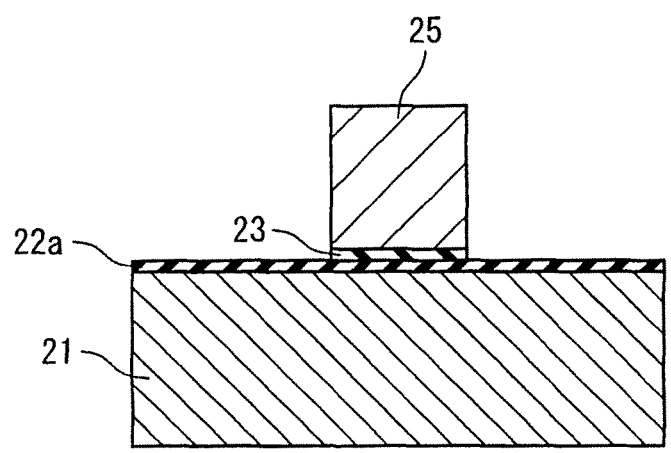
FIG. 6D is a section view showing the method of manufacturing the semiconductor device according to the embodiment of the present invention.

On the other hand, as show in FIG. 6D, the gate electrode film 25a is etched in a specified pattern by the RIE. With this etching, the gate electrode 25 is formed so as to extend in Y direction. With this etching, the second insulating film 23a not covered with the gate electrode 25 on the top surface of the semiconductor substrate 21 is also etched, whereby the second insulating layer 23 is formed directly below the gate electrode 25. Here, the gate electrode 15 and the second insulating layer 13, and the gate electrode 25 and the second insulating layer 23 are formed by the same process.

Figure 7A:
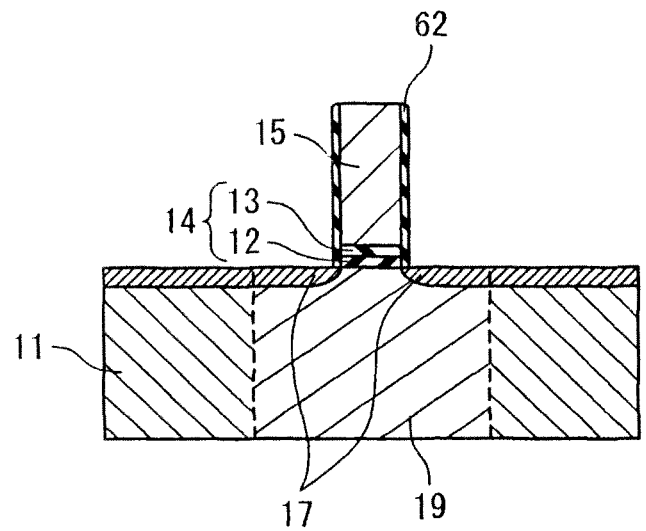
FIG. 7A is a section view showing the method of manufacturing the semiconductor device according to the embodiment of the present invention.
Figure 7B:
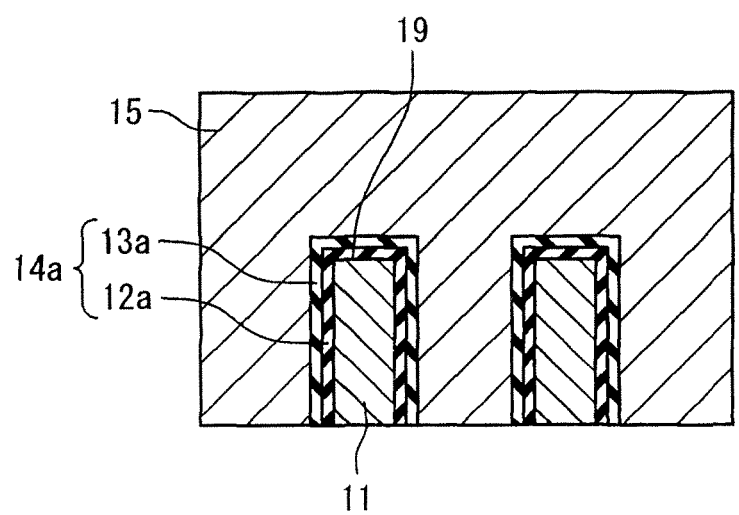
FIG. 7B is a section view showing the method of manufacturing the semiconductor device according to the embodiment of the present invention.
Figure 7C:
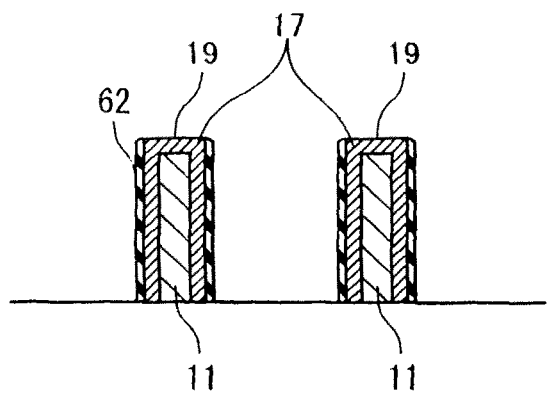
FIG. 7C is a section view showing the method of manufacturing the semiconductor device according to the embodiment of the present invention.

Next, as shown in FIGS. 7A to 7C, the second insulating film 13a on the side of the fin 19 is removed by wet etching. At that time, the first insulating film 12a exposed by removing the second insulating film 13a and the first insulating film 12a originally exposed are also removed at the same time. With this wet etching, the first insulating layer 12 is formed directly below the second insulating layer 13 which is formed directly below the gate electrode 15. Subsequently, a silicon nitride film is formed in a thickness of 3 nm and is etched back by the RIE to form the offset spacers 62. Then, halo implant (e.g., B ion) and extension implant (e.g., As ion) are performed to the surface regions of the fins 19 of the semiconductor substrate 11 by plasma doping with the gate electrode 15 used as a mask. As a result, the extension regions 17 are formed on the surface regions of the fins 19 of the semiconductor substrate 11 except for a region directly below the gate electrode 15. When the plasma doping is used, impurity ions are implanted into the surface regions of the fins 19, which will become channel surfaces, on the principle of dispersion and diffusion. However, the halo implant may be omitted according to device characteristics.

In the doping of the ions, the offset spacer 62 of a thin insulating film exists only in a portion (side wall portion) of the surface region of the fin 19. Thus, even if the plasma doping that uses the principle of dispersion and diffusion and that is relatively low in energy level is used, the impurity ions can be reliably implanted. Moreover, since the spacing between the fins 19 is narrow, the implantation of the impurity ions by a conventional ion implantation apparatus easily causes shadowing. On the other hand, in the present invention, the plasma doping using the principle of dispersion and diffusion dose not cause the shadowing, whereby the impurity ions can be certainly implanted.

Figure 7D:
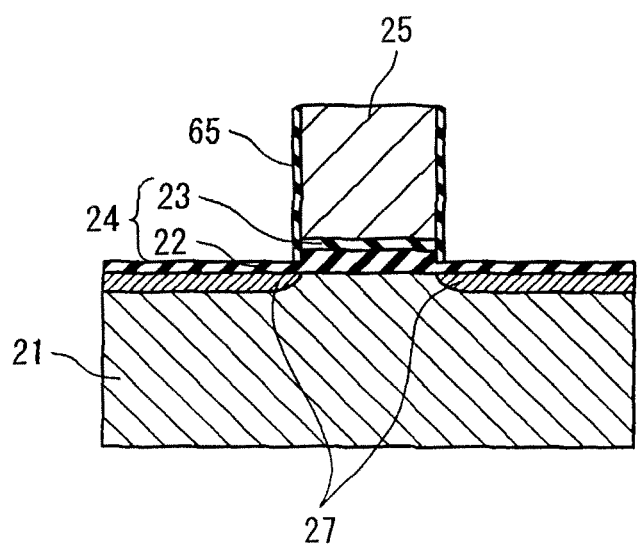
FIG. 7D is a section view showing the method of manufacturing the semiconductor device according to the embodiment of the present invention.

On the other hand, as shown in FIG. 7D, the surface of the first insulating film 22*a* exposed to the surface is partially etched by the wet etching shown in FIGS. 7A to 7C. However, since the film thickness of the first insulating film 22*a* is thicker than the film thickness of the first insulating film 12*a*, the most portion of the first insulating film 22*a* is left in this wet etching process and hence the first insulating layer 22 is formed as shown in FIG. 7D. Subsequently, a silicon nitride film is formed in a thickness of 3 nm and is etched back by the RIE to form the offset spacers 65. This process is performed at the same time of forming the offset spacers 62 shown in FIGS. 7A to 7C. Then, halo implant (e.g., B ion) and extension implant (e.g., As ion) are performed to the surface region of the semiconductor substrate 21 by the ion implantation or the plasma doping with the gate electrode 25 used as a mask. As a result, the extension regions 27 are formed on the surface region of the semiconductor substrate 21 except for a region directly below the gate electrode 25.

However, the wet etching of the first insulating film 12*a* and the first insulating film 22*a* is performed by the same process. On the other hand, the extension regions 17 and the extension regions 27 are formed separately by the use of a resist mask. For example, a region (first region), in which the FinFET 10 is to be formed, is subjected to the plasma doping with a region (second region), in which the PlanarFET 20 is to be formed, masked by resist. Next, the resist is removed and the region (second region), in which the PlanarFET 20 is to be formed, is subjected to the ion implantation or the plasma doping with the region (first region), in which the FinFET 10 is to be formed, masked by resist. Finally, the resist is removed. In the process of removing the resist, the SPM solution is used as the liquid for removing the resist, and hence when the TiN layers of the gate electrodes 15, 25 are exposed, the TiN layers are etched off. To prevent the TiN layers from being etched off, in the gate electrodes 15, 25, the top surfaces of the TiN layers are covered with the amorphous silicon layers and the side surfaces of the TiN layers are covered with the offset spacers 62, 65. This prevents the TiN layers from being etched off.

Figure 8A:
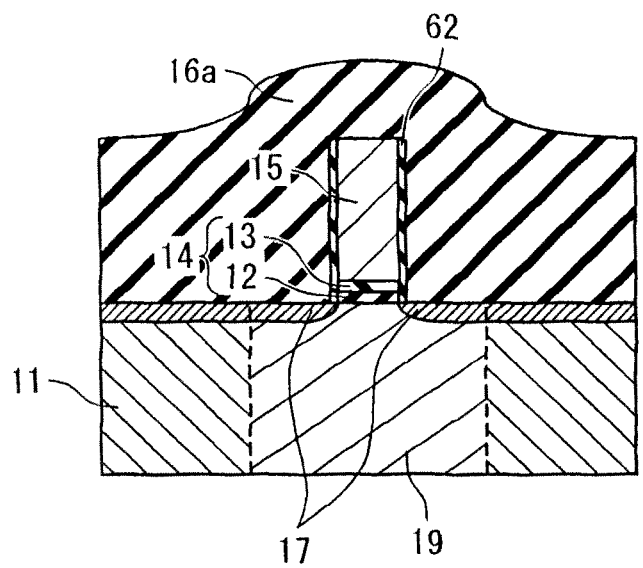
FIG. 8A is a section view showing the method of manufacturing the semiconductor device according to the embodiment of the present invention.
Figure 8B:
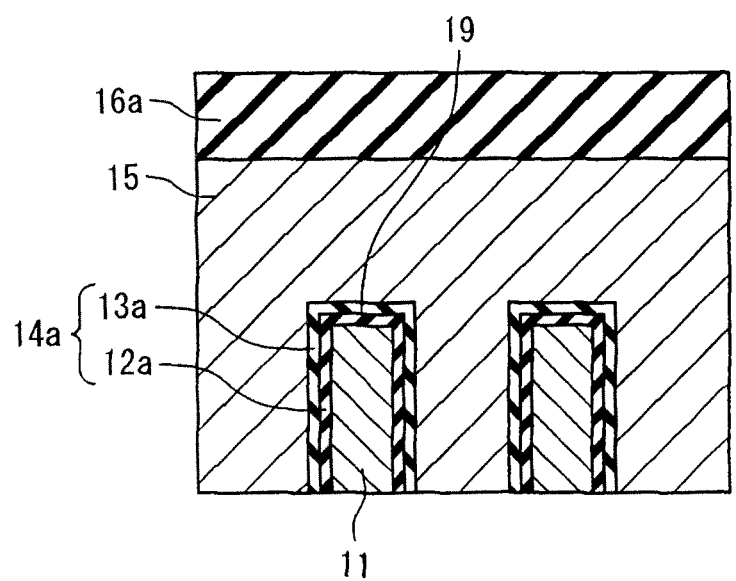
FIG. 8B is a section view showing the method of manufacturing the semiconductor device according to the embodiment of the present invention.
Figure 8C:
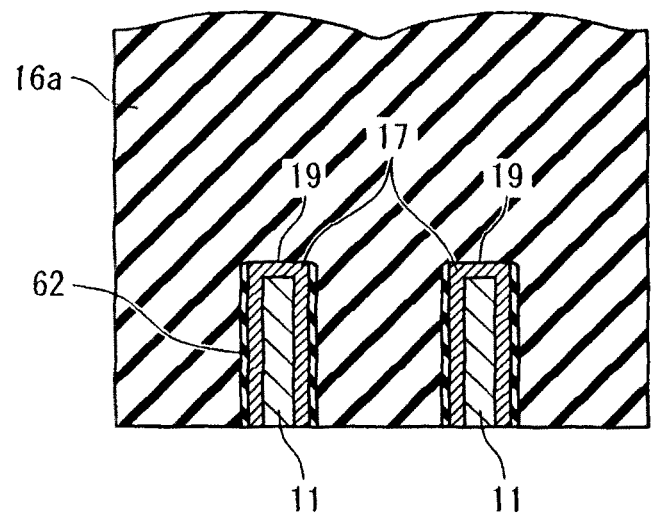
FIG. 8C is a section view showing the method of manufacturing the semiconductor device according to the embodiment of the present invention.

Next, as shown in FIGS. 8A to 8C, an offset film 16*a* (e.g., silicon nitride) is formed, for example, in a film thickness of about 20 nm by the CVD method so as to cover the semiconductor substrate 11 and the gate electrode 15.

Figure 8D:
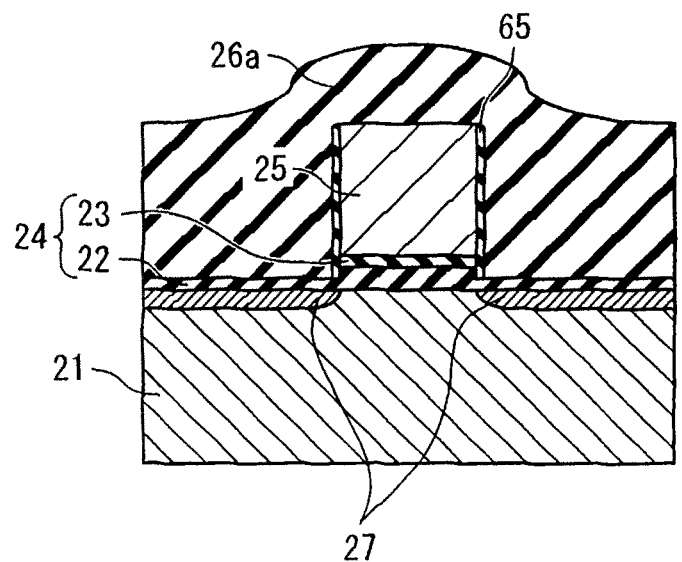
FIG. 8D is a section view showing the method of manufacturing the semiconductor device according to the embodiment of the present invention.

On the other hand, as shown in FIG. 8D, an offset film 26*a* (e.g., by silicon nitride) is formed, for example, in a film thickness of about 20 nm by the CVD method so as to cover the semiconductor substrate 21 and the gate electrode 25.

Here, the offset film 16*a* and the offset film 26*a* are formed by the same process and of the same film.

Figure 9A:
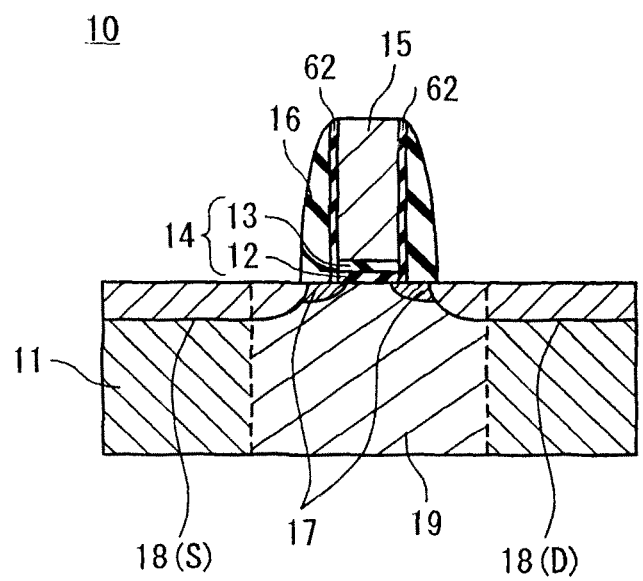
FIG. 9A is a section view showing the method of manufacturing the semiconductor device according to the embodiment of the present invention.
Figure 9B:
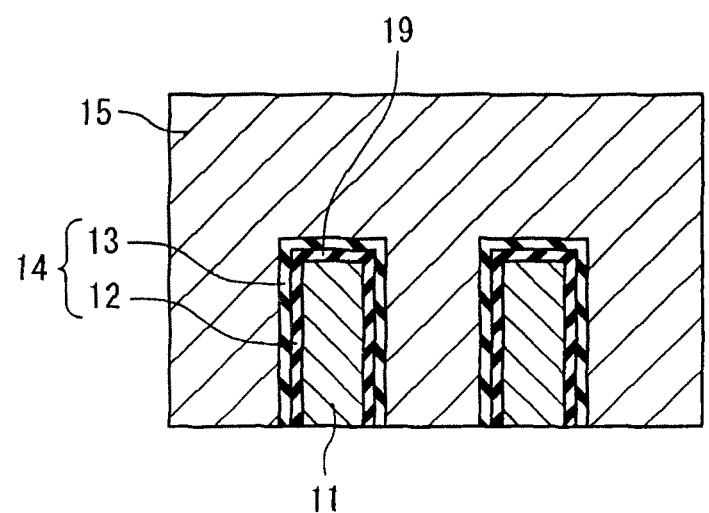
FIG. 9B is a section view showing the method of manufacturing the semiconductor device according to the embodiment of the present invention.
Figure 9C:
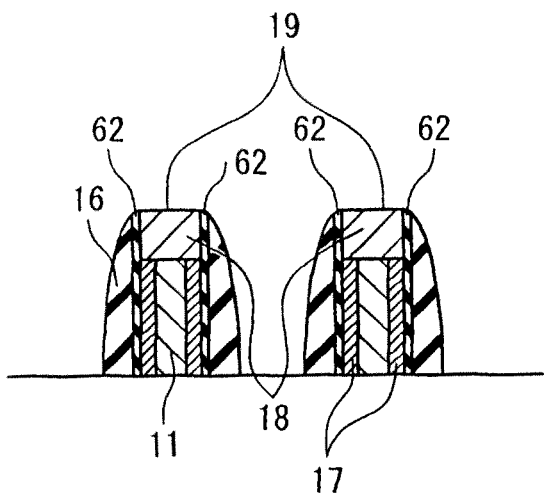
FIG. 9C is a section view showing the method of manufacturing the semiconductor device according to the embodiment of the present invention.

Next, as shown in FIGS. 9A to 9C, the offset film 16*a* is etched back to form the side walls 16 on the side surfaces of the gate electrode 15. Then, impurity implantation (e.g., As ion) for a diffusion layer is performed into the surface region of the semiconductor substrate 11 by ion implantation with the gate electrode 15 used as a mask. As a result, the source (S) 18 and the drain (D) 18 are formed in the surface region of the semiconductor substrate 11 except for a portion directly below the gate electrode 15 and the side walls 16.

Figure 9D:
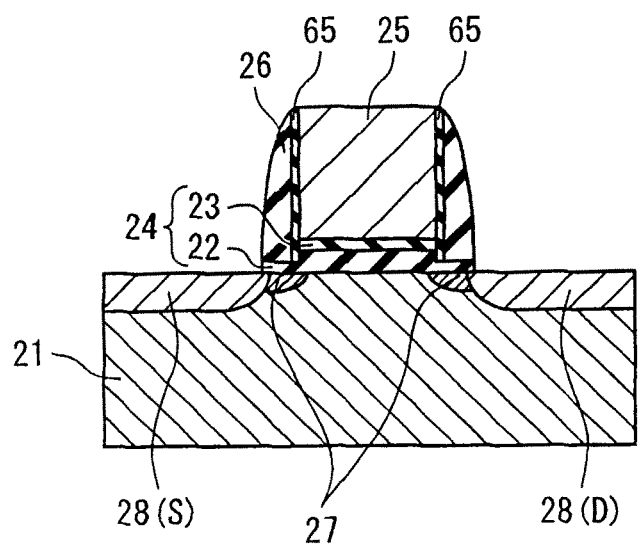
FIG. 9D is a section view showing the method of manufacturing the semiconductor device according to the embodiment of the present invention.

On the other hand, as shown in FIG. 9D, the offset film 26*a* is etched back to form the side walls 26 on the side surfaces of the gate electrode 25. Then, impurity implantation (e.g., As ions) for a diffusion layer is performed into the surface region of the semiconductor substrate 21 by ion implantation with the gate electrode 25 used as a mask. As a result, the source (S) 28 and the drain (D) 28 are formed in the surface region of the semiconductor substrate 21 except for a portion directly below the gate electrode 25 and the side walls 26.

Here, the offset film 16*a* and the offset film 26*a* are etched back by the same process. Further, the source (S) 18 and the drain (D) 18 and the source (S) 28 and the drain (D) 28 are formed by the same process.

By the process described above, the method of manufacturing the semiconductor device according to the embodiment of the present invention, which forms the FinFET 10 and the PlanarFET 20 on the same chip, can be performed.

Figure 12:
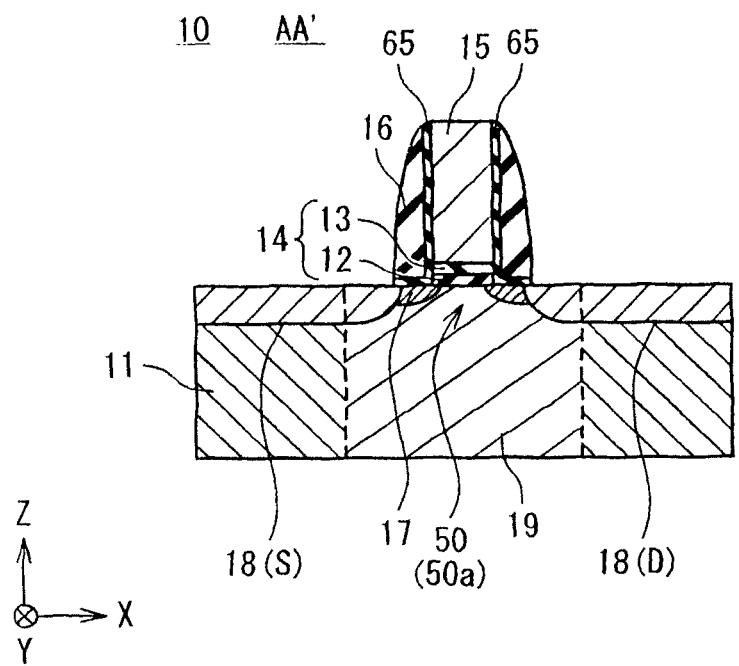
FIG. 12 is a section view along the line AA' showing another structure of the semiconductor device according to the embodiment of the present invention.
Figure 13:
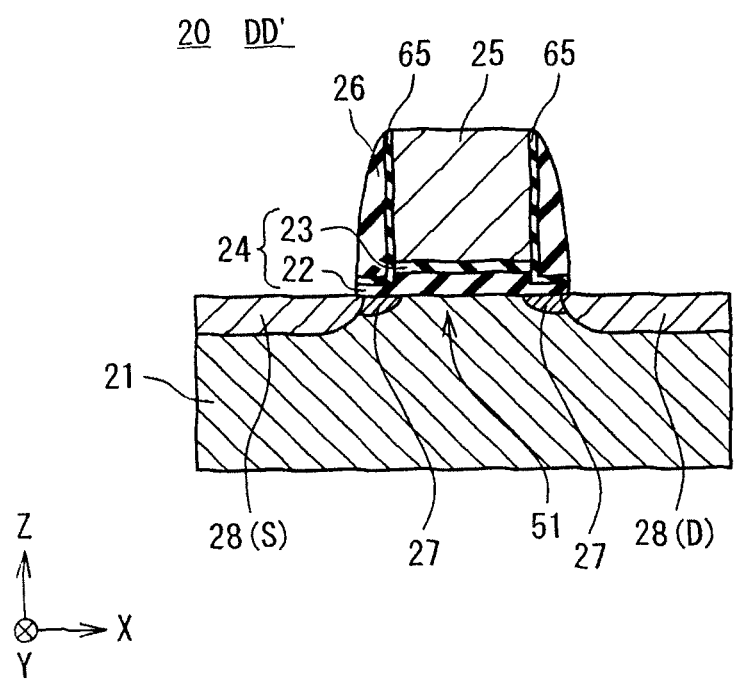
FIG. 13 is a section view along the line DD' showing the another structure of the semiconductor device according to the embodiment of the present invention.

In the method of manufacturing the semiconductor device described above, the silicon nitride film is formed in a thickness of 3 nm and is then etched back by the RIE to form the offset spacers 62, 65 on the side walls of the gate electrodes 15, 25, as an example. However, it may be employed that the offset spacers 62, 65 are formed only by forming the silicon nitride film without etching-back the silicon nitride film by the RIE. In this case, the process of etching-back the silicon nitride film is eliminated, so that there is provided an advantage that the fin 19 having the extension implant regions 17 formed thereon does not have a layer damaged by dry etching. In this case, the section view of the FinFET 10 along the line AA' in FIG. 1 is shown in FIG. 12. Further, the section view of the PlanarFET 20 along the line DD' in FIG. 1 is shown in FIG. 13. In this case, when the side walls 16, 26 on the side walls of the gate electrodes 15, 25 are formed, the silicon nitride film is etched back and is formed in the shape of the offset spacers 62, 65.

Figure 14:
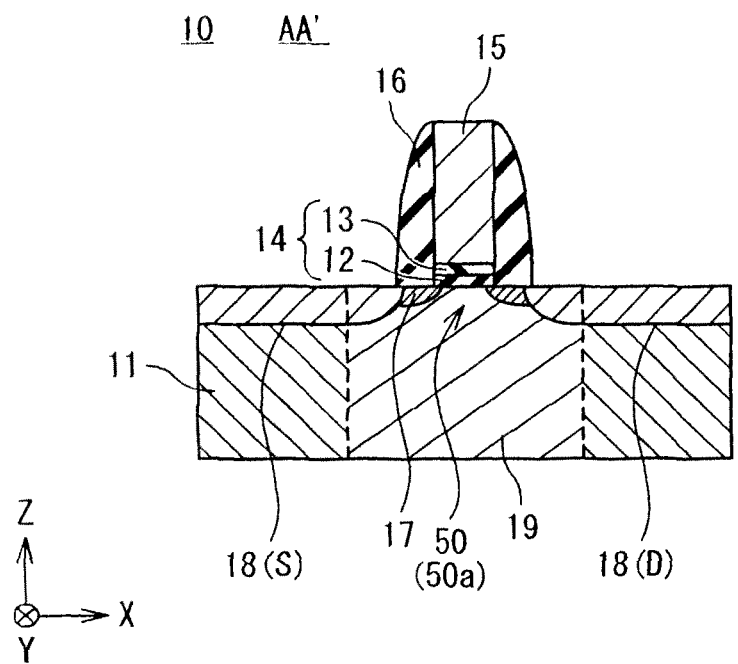
FIG. 14 is a section view along the line AA' showing still another structure of the semiconductor device according to the embodiment of the present invention.
Figure 15:
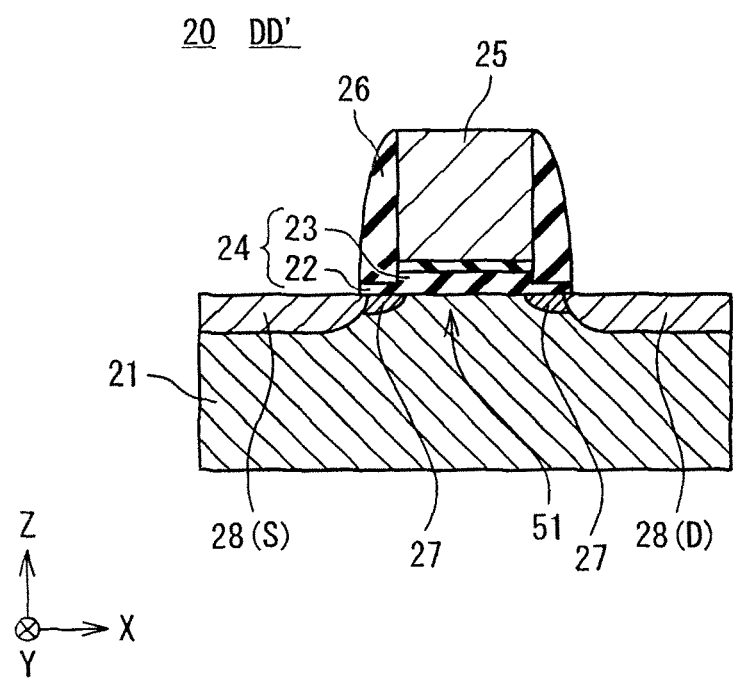
FIG. 15 is a section view along the line DD' to show the still another construction of the semiconductor device according to the embodiment of the present invention.

Further, in the case where the gate electrodes 15, 25 are formed of a single layer film made of W, TaSi, or TaSiN, there is no possibility that the gate electrode is etched by the resist removing solution such as the SPM solution or the like. Thus, the offset spacers 62, 65 may be omitted. In this case, the section view of the FinFET 10 along the line AA' in FIG. 1 is shown in FIG. 14 and the section view of the PlanarFET 20 along the line DD' in FIG. 1 is shown in FIG. 15.

Figure 10:
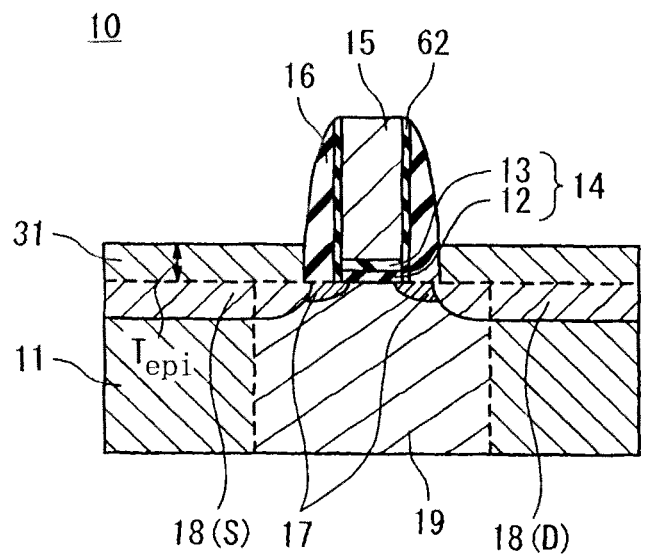
FIG. 10 is a section view showing a modification of the structure of the semiconductor device according to the embodiment of the present invention.

In this regard, the FinFET 10 is larger in parasitic resistance than the PlanarFET 20. To avoid this, it may be employed that a structure that silicon is epitaxially grown on the regions of the source (S) 18 and the drain (D) 18. This structure is shown in FIG. 10. That is, FIG. 10 is a section view showing a modification of the structure of the semiconductor device according to the embodiment of the present invention. FIG. 10 corresponds to the section view along the line AA' in FIG. 1. A silicon epitaxial layer 31 having a film thickness of Tepi is formed on the regions of the source (S) 18 and the drain (D) 18. This structure can reduce the parasitic resistance in the FinFET 10 (see non-patent literature 1). On the other hand, one of the defects caused when silicon is epitaxially grown is an increase in parasitic capacitance between the gate electrode and the source and the drain. In the PlanarFET 20 having a relatively long gate length, channel resistance is not so low and the contribution of parasitic resistance is small.

Thus, it is desired from the viewpoint of characteristics of the device that silicon is epitaxially grown only for the FinFET 10 so as to reduce the parasitic resistance. In other words, it is preferable to adopt such a structure that silicon is epitaxially grown for the FinFET 10 and that silicon is not epitaxially grown for the PlanarFET 20.

Figure 11:
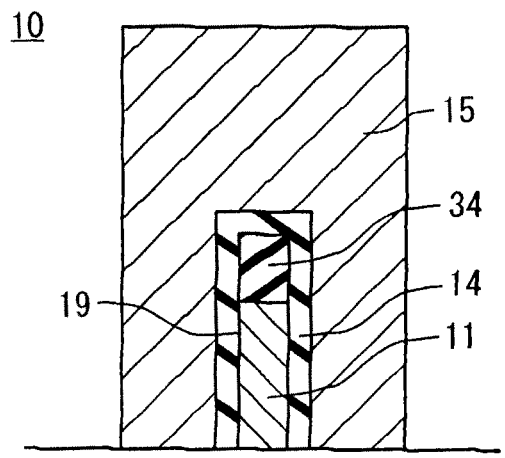
FIG. 11 is a section view showing another modification of the structure of the semiconductor device according to the embodiment of the present invention.

Further, in the FinFET 10, an insulating layer may be formed on the top of the fin 19. This structure is shown in FIG. 11. FIG. 11 is a section view showing another modification of the structure of the semiconductor device according to the embodiment of the present invention. FIG. 11 corresponds to a section view along the line BB' in FIG. 1. An insulating layer 34 (e.g., silicon oxide or silicon nitride) is formed on the top of the fin 19. This structure can limit the channel region in the fin 19 only to the side surfaces thereof. This structure is thought to be effective in the case where a carrier mobility in the channel region at the surface orientation of the side surface is higher than a carrier mobility in the channel region at the surface orientation of the top surface. For example, when the FinFET 10 made of p type silicon has the top surface of a surface orientation (100) and the side surface of a surface orientation (110), the carrier mobility of the channel region of the surface orientation (110) is about 1.5 times the carrier mobility of the channel region of the surface orientation (100). Thus, when the insulating layer 34 is formed on the top surface of the surface orientation (100), the insulating layer 34 is resistant to having a gate voltage applied thereto. Thus, the top surface of the surface orientation (100) is not used as the channel region, but only the side surface of the surface orientation (110) can be used as the channel region.

In the case where the semiconductor device is configured using the FinFET only, it is very difficult to realize a high-withstand voltage transistor for the I/O system. This is because since the FinFET has a channel formed in a three-dimensional structure and hence has a corner in the channel, the insulating film formed in the corner of the channel has a low withstand voltage and hence cannot realize a high withstand voltage. On the other hand, in the case where the semiconductor device is configured using the PlanarFET only, a high performance fine miniaturized transistor that has high resistance to short channel effect and small random variations cannot be realized.

However, according to the present invention, the FinFET and the PlanarFET can be formed together on the same chip. That is, the transistor having a short gate length is configured using the FinFET. This can realize the high performance fine miniaturized transistor that has high resistance to short channel effect and small random variations. On the other hand, the transistor (that has a thick gate insulating film) for the I/O system or the analog system that has a long gate length and that needs to have a high withstand voltage is configured using the PlanarFET. This structure eliminates the need for forming along fin that is hard to make from the viewpoint of manufacture (in the case of forming a transistor having a long gate length, a long fin inevitably needs to be formed) and hence can realize such a transistor for the I/O system or the analog system that has a long gate length and a thick gate insulating film. As a result, the semiconductor device can reduce a chip area by fine miniaturization while keeping or improving characteristics required of each element.

Further, in the present invention, it is preferable to employ the following structure: in the FinFET, silicon is epitaxially grown on the regions of the source and the drain to swell up the regions of the source and the drain, whereas in the PlanarFET, silicon is not epitaxially grown. This structure can prevent an increase in the parasitic capacitance between the gate electrode and the source and the drain in the PlanarFET and at the same time can reduce the parasitic resistance in the FinFET.

It will be apparent that the present invention is not limited to the respective embodiments described above and the embodiments can be changed or modified as appropriate within the scope of the technical idea of the present invention. Moreover, the abovementioned techniques can be combined appropriately with each other as far as the combination of the techniques does not raise contradiction. For example, the techniques described in FIG. 10 and FIG. 11 can be combined with the other structures (shown in FIG. 2A/FIG. 4, FIG. 12/FIG. 13, and FIG. 14/FIG. 15).

It is apparent that the present invention is not limited to the above embodiment, but may be modified and changed without departing from the scope and spirit of the invention.

Although the present invention has been described above in connection with several exemplary embodiments thereof, it would be apparent to those skilled in the art that those exemplary embodiments are provided solely for illustrating the present invention, and should not be relied upon to construe the appended claims in a limiting sense.

What is claimed is:

1. A method of manufacturing a semiconductor device, the method comprising:
providing a semiconductor substrate, the semiconductor substrate including:
a first region where a FinFET (Fin Field Effect Transistor) is to be formed, and a second region where a PlanarFET (Planar Field Effect Transistor) is to be formed, wherein the first region includes:
a plurality of fins formed on a substrate and parallel to each other,
a first insulating film formed on the plurality of fins,
a second insulating film formed on the first insulating film, and
a first conducting film formed on the second insulating film,
wherein the first insulating film, the second insulating film, and the first conducting film have a pattern of a first gate electrode of the FinFET,
wherein the second region includes:
the first insulating film formed on the substrate,
the second insulating film formed on the first insulating film, and
the first conducting film formed on the second insulating film,
wherein the first insulating film, the second insulating film, and the first conducting film have a pattern of a second gate electrode of the PlanarFET,
wherein a thickness of the first insulating film in the second region is greater than a thickness thereof in the first region;
forming first extension regions in the plurality of fins in the first region by a plasma doping method using the first gate electrode as a mask;
forming second extension regions in the second region by one of an ion implantation method and a plasma doping method using the second gate electrode as a mask;
forming first side walls and second side walls on side surfaces of the first gate electrode and on side surfaces of the second gate electrode, respectively; and
forming a source and a drain of the FinFET in the first region by an ion implantation method using the first gate electrode and first side walls as masks and forming a source and a drain of the PlanarFET in the second region by an ion implantation method using the second gate electrode and second side walls as masks, at the same time.

2. The method of manufacturing a semiconductor device according to claim 1, wherein the providing the semiconductor substrate includes:
forming the first insulating film such that the first region and the second region are covered with the first insulating film and the thickness thereof in the second region is greater than the thickness thereof in the first region,
forming the second insulating film and the first conducting film such that the first insulating film is covered with the second insulating film and the second insulating film is covered with the first conducting film,
etching the first conducting film such that the first gate electrode is formed at the first region and the second gate electrode is formed at the second region, and
etching the second insulating film and the first insulating film such that the second insulating film and the first insulating film are removed except those under the first gate electrode in the first region, and the second insulating film and an upper part of the first insulating film are removed except those under the second gate electrode in the second region.

3. The method of manufacturing a semiconductor device according to claim 1, wherein a gate length of the PlanarFET is longer than a gate length of the FinFET.

4. The method of manufacturing a semiconductor device according to claim 1, further comprising:
forming a third insulating film such that the first region and the second region are covered with the third insulating film, after the providing step.

5. The method of manufacturing a semiconductor device according to claim 4, further comprising:
etching the third insulating film to form a first offset spacer on side surfaces of the first gate electrode and the plurality of fins in the first region and to form a second offset spacer on side surfaces of the second gate electrode in the second region, after the step of forming the third insulating film.

6. The method of manufacturing a semiconductor device according to claim 1, further comprising:
making top surfaces of a source and a drain of the FinFET swell up from a level of a boundary between the first gate insulating film and a first channel region,
wherein top surfaces of a source and a drain of the PlanarFET is at a level of a boundary between the first gate insulating film and a second channel region.

7. The method of manufacturing a semiconductor device according to claim 1, further comprising:
forming an insulating portion on a top surface of each of the plurality of fins.

8. The method of manufacturing a semiconductor device according to claim 1, wherein the FinFET is a core transistor, and
wherein the PlanarFET is an I/O transistor.

9. A method of manufacturing a semiconductor device, the method comprising:
providing a semiconductor substrate, the semiconductor substrate including:
a first region where a FinFET (Fin Field Effect Transistor) is to be formed, and
a second region where a PlanarFET (Planar Field Effect Transistor) is to be formed,
wherein the first region includes:
a plurality of fins formed on a substrate and parallel to each other,
a first insulating film formed on the plurality of fins,
a second insulating film formed on the first insulating film, and
a first conducting film formed on the second insulating film,
wherein the first insulating film, the second insulating film, and the first conducting film have a pattern of a first gate electrode of the FinFET,
wherein the second region includes:
the first insulating film formed on the substrate,
the second insulating film formed on the first insulating film, and
the first conducting film formed on the second insulating film,
wherein the first insulating film, the second insulating film, and the first conducting film have a pattern of a second gate electrode of the PlanarFET
wherein a thickness of the first insulating film in the second region is greater than a thickness thereof in the first region;
forming first extension regions in the plurality of fins in the first region by a plasma doping method using the first gate electrode as a mask;
forming first side walls and second side walls on side surfaces of the first gate electrode and on side surfaces of the second gate electrode, respectively;
making top surfaces of a source and a drain of the FinFET swell up from a level of a boundary between the first gate insulating film and a first channel region,
wherein top surfaces of a source and a drain of the PlanarFET is at a level of a boundary between the first gate insulating film and a second channel region.

10. The method according to claim 9, wherein the providing of the semiconductor substrate comprises:
forming the first insulating film such that the first region and the second region are covered with the first insulating film and the thickness thereof in the second region is greater than the thickness thereof in the first region; and
forming the second insulating film and the first conducting film such that the first insulating film is covered with the second insulating film and the second insulating film is covered with the first conducting film.

11. The method according to claim 10, further comprising:
etching the first conducting film such that the first gate electrode is formed at the first region and the second gate electrode is formed at the second region, and
etching the second insulating film and the first insulating film such that the second insulating film and the first insulating film are removed except those under the first gate electrode in the first region, and the second insulating film and an upper part of the first insulating film are removed except those under the second gate electrode in the second region.

12. The method according to claim 9, wherein a gate length of the PlanarFET is longer than a gate length of the FinFET.

13. The method according to claim 9, further comprising:
forming a third insulating film such that the first region and the second region are covered with the third insulating film, after the providing step.

14. The method according to claim 13, further comprising:
etching the third insulating film to form a first offset spacer on side surfaces of the first gate electrode and the plurality of fins in the first region and to form a second offset spacer on side surfaces of the second gate electrode in the second region, after the step of forming the third insulating film.

15. The method according to claim 9, further comprising:
forming an insulating portion on a top surface of each of the plurality of fins,
wherein the FinFET is a core transistor, and
wherein the PlanarFET is an I/O transistor.

* * * * *